(12) United States Patent
Boudoux et al.

(10) Patent No.: US 11,451,225 B2
(45) Date of Patent: Sep. 20, 2022

(54) APPARATUS FOR DRIVING A SWITCHING DEVICE AND METHOD OF USING THE SAME

(71) Applicant: Aptiv Technologies Limited, St. Michael (BB)

(72) Inventors: Emmanuel Boudoux, Dublin (IE); Markus Heinrich, Dublin (IE)

(73) Assignee: Aptiv Technologies Limited, St. Michael (BB)

( * ) Notice: Subject to any disclaimer, the term of this patent is extended or adjusted under 35 U.S.C. 154(b) by 0 days.

(21) Appl. No.: 17/170,784

(22) Filed: Feb. 8, 2021

(65) Prior Publication Data

US 2021/0288643 A1 Sep. 16, 2021

(30) Foreign Application Priority Data

Mar. 13, 2020 (EP) .................................... 20163002

(51) Int. Cl.
*H03K 17/00* (2006.01)
*H03K 17/687* (2006.01)
(Continued)

(52) U.S. Cl.
CPC .......... *H03K 17/687* (2013.01); *H02J 7/0045* (2013.01); *H02J 7/345* (2013.01)

(58) Field of Classification Search
CPC ........... H03K 17/687; H03K 17/04123; H03K 2217/0063; H03K 2217/0081;
(Continued)

(56) References Cited

U.S. PATENT DOCUMENTS 8,773,177 B2 * 7/2014 Kikuchi ........... H03K 17/04123
327/108
9,407,190 B2 * 8/2016 Kumagai ................ H02P 27/08
(Continued)

FOREIGN PATENT DOCUMENTS

EP 2918476 9/2015
EP 3364534 8/2018
(Continued)

OTHER PUBLICATIONS

"Extended European Search Report", EP Application No. 20163002.7, dated Aug. 31, 2020, 8 pages.

*Primary Examiner* — Ryan Jager
(74) *Attorney, Agent, or Firm* — Sawtooth Patent Group PLLC

(57) ABSTRACT

This publication describes apparatuses and methods for driving a switching device and providing for the fast start-up of the switching device. In an aspect, the apparatus includes a driver circuit and a starter circuit. The driver circuit for applying control signals to a control terminal of the switching device when activated. The switching device is activatable to drive a load in an operating mode when a control signal above a threshold voltage is applied to the control terminal. The starter circuit is coupled to the control terminal and includes an energy store and a switch operable to discharge the energy store to deliver a start-up voltage above the threshold to the control terminal. As such, the switching device can be activated during a delay period before the driver circuit can generate a control signal above the threshold voltage after being activated.

20 Claims, 5 Drawing Sheets

(51) Int. Cl.
*H02J 7/00* (2006.01)
*H02J 7/34* (2006.01)

(58) Field of Classification Search
CPC ..... H03K 17/063; H03K 17/16; H02J 7/0045;
H02J 7/345; H02M 1/08; H02M 1/36
USPC ........................................................ 327/109
See application file for complete search history.

(56) References Cited

U.S. PATENT DOCUMENTS

| 2013/0222042 | A1* | 8/2013 | Kikuchi | H03K 17/04123 |
| | | | | 327/374 |
| 2013/0241601 | A1* | 9/2013 | Chen | H03K 17/063 |
| | | | | 327/108 |
| 2021/0288643 | A1* | 9/2021 | Boudoux | H03K 17/687 |

FOREIGN PATENT DOCUMENTS

| EP | 2936681 | 6/2019 |
| FR | 2899400 | 11/2008 |
| JP | 2002223157 | 8/2002 |
| JP | 2008182381 | 8/2008 |
| JP | 2010035387 | 2/2010 |
| JP | 2014166085 | 9/2014 |

* cited by examiner

APPARATUS FOR DRIVING A SWITCHING DEVICE AND METHOD OF USING THE SAME

CROSS-REFERENCE TO RELATED APPLICATION

This application claims priority to European Patent Application Number EP20163002.7, filed Mar. 13, 2020, the disclosure of which is hereby incorporated by reference in its entirety herein.

INTRODUCTION

The present disclosure relates to an apparatus and method for driving a switching device and, in particular, a drive circuit for a MOSFET (metal-oxide-semiconductor field-effect transistor), and most particularly a power amplifier circuit.

BACKGROUND

Switching devices, such as High-Side N MOSFETs, are often used in the automotive industry as part of a power amplifier circuit for supplying high current power for driving various electronic systems using the vehicle's DC battery. FIG. 1 shows an example of such a High-Side N MOSFET switching circuit. In use, current is supplied from the vehicle's battery 1, with the positive terminal connected to the MOSFET's drain 3 and the negative terminal connected to the MOSFET's source 5 though a load 7. The load may be, for example, the vehicle's Engine Control Unit (ECU). The MOSFET's gate 6 is driven by the output 8 from a gate driver 9. The gate driver 9 is connected to the source 5 of the MOSFET 4 through driver terminal 10. An internal charge pump charges the driver capacitor 2 at a voltage higher than the battery 1 voltage. When the gate driver's output 8 applies a driving voltage to the gate 6 which exceeds a threshold voltage, the MOSFET 4 is activated for supplying the load 7 during its operating mode.

An issue with this type of high current circuit is that the MOSFET 4 is current consuming. Therefore, in order to conserve power during periods when the load 7 is not actively operating, it is common to deactivate the gate driver 9. However, once the gate driver 9 is turned off, any electrical charge stored at the driver capacitor 2 is lost through leakage currents. Consequently, when the gate driver circuit 9 is reactivated, it is necessary to recharge the driver capacitor 2. As such, oscillation of the gate driver 9 must pump charges into the capacitor 2 for building the voltage, before the MOSFET 4 can be turned on.

To explain this further, FIG. 1 schematically shows the concept of the gate capacitor 25 at the gate-source junction formed by the gate electrode 6 within the MOSFET 4. As will be appreciated, the high current MOSFET 4 has a large parasitic input capacitance $C\_gs$. Therefore, the 'gate capacitor 25' $C\_gs$ must be charged by C in dry through the gate driver's output 8 before the MOSFET 4 is activated. The capacitance C in dry of driver capacitor 2 consequently needs to be greater than $C\_gs$ to cause this activation. As a result, the driver capacitor 2 takes time to charge.

For the above reason, there is therefore often a significant delay before for the voltage generated by the drive circuit 9 rises above the MOSFET gate 6 threshold in order to activate the MOSFET 4. Accordingly, when a load is activated, there is a lag before the MOSFET 4 is activated for delivering the high current demanded by the load for those operating mode operations.

The above issue presents a particular problem in modern automobiles in which a number of loads have "sleep mode" where low levels of power are required even while the load is not operating. For example, certain loads, such as the vehicle's ECU, switch to a standby or sleep mode when the vehicle is turned off in order to maintain certain critical systems. For instance, operating software may be maintained to avoid having to reboot the system when the vehicle is turned on. In the case of an ECU, current demands during this sleep mode may be in the range of 5-100 microamps (μm), whereas demands during the normal operating mode may be much higher, for instance, in the milliamps (mA) range. Accordingly, it is common to provide an alternative low current power circuit for maintaining these operations while in sleep mode. When current demands from a load subsequently increase, the circuit is then switched over to the high current supply. However, during this switching step, there is often an interruption in the current supply due to the above mentioned lag caused when the gate driver is activated. At the same time, the ECU, in particular, will often have a period of relatively high current consumption immediately after being woken from the sleep mode as various diagnostic programs initialise. As such, the aforementioned supply interruption, along with an associated rapid drop in voltage, will typically interrupt the ECU during this critical initial wake up phase. As a consequence, ECUs are normally not able to withstand a power interruption of more than 100 microseconds (μs) without risking the resetting of logic functions or requiring time to reload software.

The present disclosure is therefore directed to addressing these issues.

SUMMARY

According to a first aspect there is provided an apparatus comprising: a driver circuit for applying control signals to a control terminal of a switching device when activated, the switching device being activatable for driving a load in an operating mode when a control signal above a threshold voltage is applied to the control terminal; and a start-up circuit coupled to the control terminal and comprising an energy store and a switch operable to discharge the energy store for delivering a start-up voltage above the threshold voltage to the control terminal for activating the switching device during a delay period before the driver circuit generates a control signal above the threshold voltage after being activated.

In this way, when a load transitions from a sleep mode to an operating mode, the delay in activating the switching device, which might otherwise result from the time taken for the driver circuit to build the required threshold voltage after being switched on, is avoided. That is, in embodiments, the energy store may discharge rapidly, in the order of tenths of a nanosecond, to quickly activate the switching device. This thereby fills the lag time taken for the control signals generated by driver circuit to build to above the threshold voltage, after which point the driver circuit will control the switching device. In power amplifier arrangements, this provides for the rapid delivery of a high current for powering a load or loads in their operating modes. In embodiments where a load has a sleep mode in which a low current is required to maintain standby functions, a low power circuit may further be provided. In such embodiments, the arrangement may provide for a rapid response to a change in current demand from the load when it is woken up, and may therefore provide an uninterrupted transition from a low current supply to a high current supply.

In embodiments, the apparatus further comprises a controller for actuating the switch to discharge the energy store in response an increased current demand by the load. In this way, the apparatus may respond automatically to a detected rise in current demand. As such, as a load is woken from its respective sleep mode and draws more current, the apparatus may respond to supply that demand.

In embodiments, the energy store comprises a capacitor. In this way, a stored charge may be rapidly discharged to quickly apply a control signal above the threshold voltage. At the same time, in embodiments where a voltage is applied to the capacitor during the sleep mode, the capacitor will charge up to a predetermined level based on its capacitance and then not consume further current. As such, the capacitor can remain charged, ready for discharge upon activation of the operating mode, without compromising efficiency. In embodiments, the capacitor may be a ceramic capacitor.

In embodiments, the energy store comprises charging connections for connecting the energy store to a power source for charging the energy store. In this way, the capacitor can be charged and maintained in a charged state by a power source, such as a battery.

In embodiments, the switch comprises a bypass connection for bypassing the charging connections when the switch is operated. In this way, the charge applied to the energy store can be discharged by bypassing the energy store's connection to the power source and hence removing the potential difference applied thereby.

In embodiments, the charging connections comprise a first diode for directing current discharged from the energy store to the control terminal.

In embodiments, the apparatus further comprises a start-up connection for connecting the energy store to the control terminal of a switching device, wherein the start-up connection comprises a second diode for preventing current flowing from a driver circuit to the energy store. The second diode may thereby prevent reverse current flows from the driver circuit from charging the energy store.

In embodiments, the start-up connection further comprises a resistor connected between the anode of the second diode and a negative terminal of a power source. This may thereby maintain operation of the second diode.

In embodiments, the driver circuit comprises an output connection for connecting the driver circuit to the control terminal, wherein the output connection comprises a blocking component for preventing reverse current flowing to the driver circuit.

In embodiments, the blocking component comprises at least one of a diode and a bypass switch. In embodiments, a diode may permit current to only flow from the driver circuit to the control terminal. In other embodiments, a bypass switch may be provided in addition to the diode.

In embodiments, the controller actuates the switch for recharging the energy store after a predetermined time interval following actuation to discharge the energy store. In this way, the time taken to activate the switching device can be predicted based on the estimated discharge characteristics of the energy store. Accordingly, following the triggering of the start-up sequence to activate the switching device, the start-up circuit can be reset to recharge the energy store for when it is needed again.

In embodiments, the controller actuates the switch for recharging the energy store in response to the detection of the switching device being activated. In this way, the controller can reset the start-up circuit for recharging the energy store as soon as it is determined that the switching device has been reactivated.

In embodiments, the switching device is a MOSFET. In embodiments, the switching device may be a High-Side N MOSFET. In embodiments the switching device and gate driver may provide a power amplifier circuit.

In embodiments, the power supply is a battery. In this way, the start-up circuit, the driver circuit, and the switching device may be powered by a direct current.

According to a second aspect, there is provided a method of activating a switching device for driving a load in an operating mode, the switching device being activatable in response to a control signal above a threshold voltage being applied to a control terminal, the method comprising: providing a driver circuit for applying control signals to the control terminal of the switching device when activated; providing a start-up circuit coupled to the control terminal and comprising an energy store for storing a charge above the threshold voltage and a switch for discharging the energy store; and operating the switch to discharge the energy store to deliver a start-up voltage to the control terminal for activating the switching device during a delay period before the driver circuit generates a control signal above the threshold voltage after being activated.

BRIEF DESCRIPTION OF DRAWINGS

Illustrative embodiments will now be described with reference to the accompanying drawing in which.

DETAILED DESCRIPTION

Figure 2:
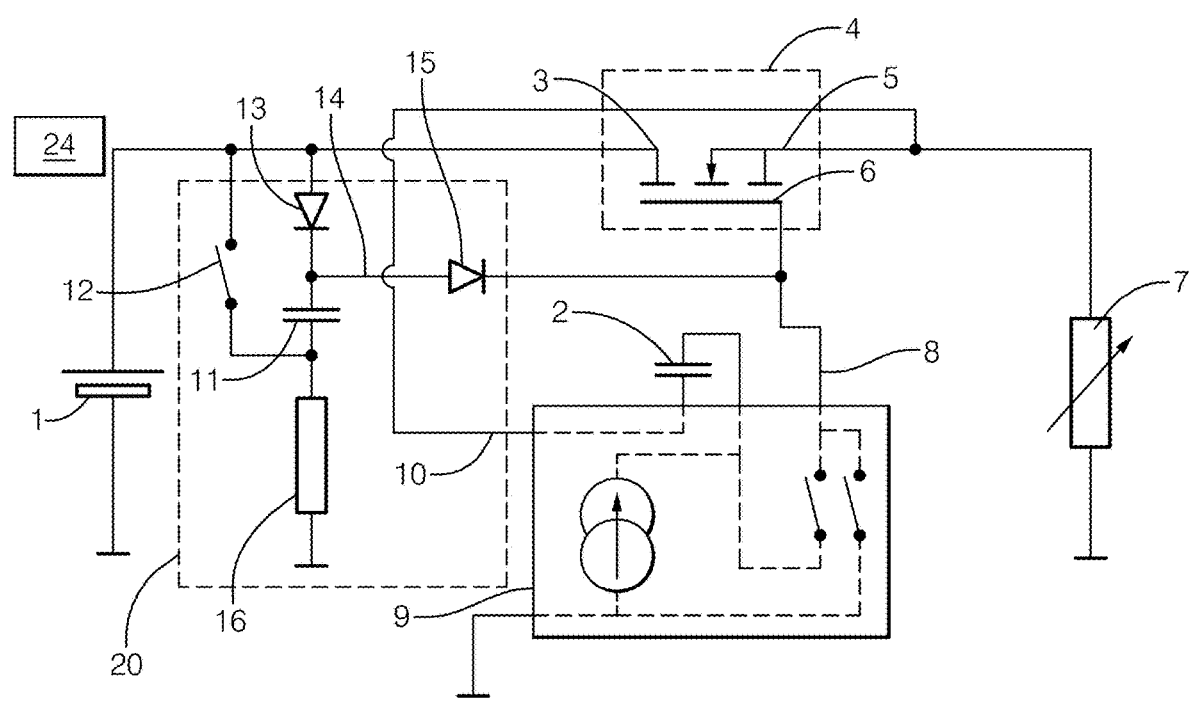
FIG. 2 shows a first embodiment of an apparatus for providing the fast start-up of a switching device.

FIG. 2 shows a first embodiment of an apparatus for providing the fast start-up of a switching device 4. In this embodiment, the switching device 4 is provided as High-Side N MOSFET, with a drain terminal 3, a source terminal 5, and a gate terminal 6.

Figure 1:
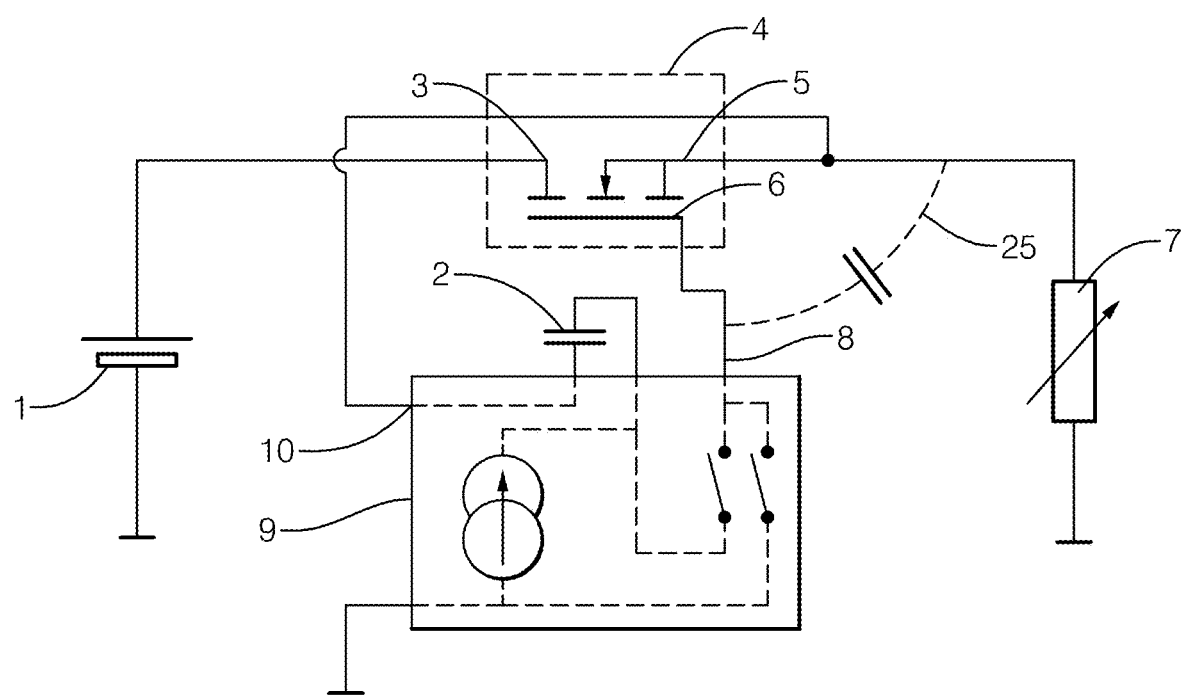
FIG. 1 shows a conventional switching device and gate driver circuit.
Figure 5:
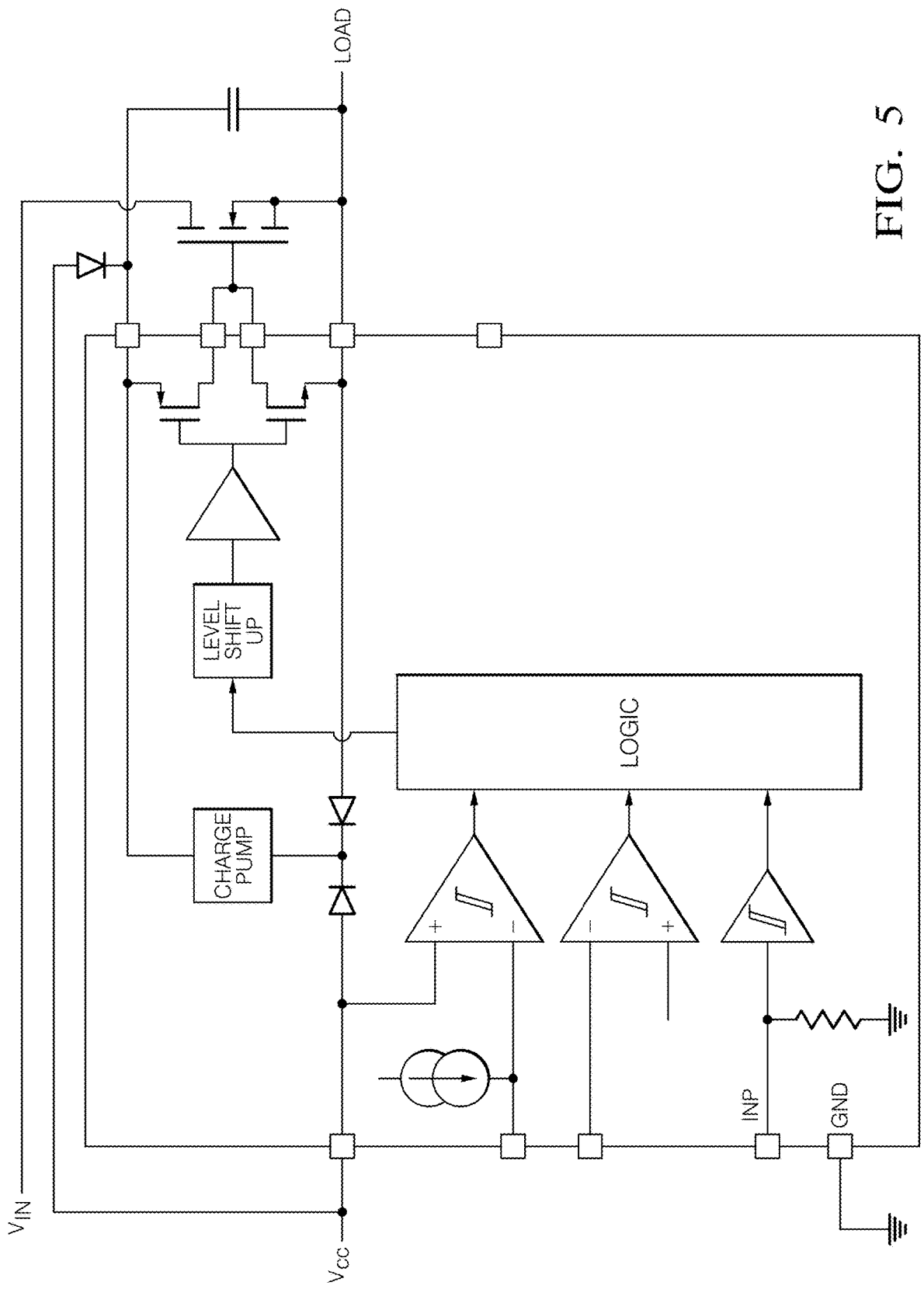
FIG. 5 shows an illustrative gate driver.

As with the conventional circuit shown in FIG. 1, the gate terminal 6 functions as a control terminal, controlled by the output connection 8 from the driver circuit 9. The driver circuit 9 itself may be implemented according to various different driver circuit designs known in the art, such as a charge pump, an inductive booster, or other such power amplifier arrangement. FIG. 5 shows an illustrative example of a gate driver circuit. As discussed above, such drive circuits 9 are known to have a delay after activation before they are able to build a sufficient voltage at the gate 6 for activating the MOSFET 4.

The embodiment shown in FIG. 2 is further provided with a starter circuit 20 which is used to deliver a start-up voltage to the MOSFET gate 6. The starter circuit 20 comprises an energy store or tank, provided as capacitor 11, the anode of which is connected to the positive terminal of the battery 1 through a first diode 13. The cathode of the capacitor 11 is connected to the negative terminal of the battery 1 through a first resistor 16, which acts to limit the current flow through the capacitor 11. With this arrangement, the capacitor 11 is charged by the battery 1 up to voltage V_bat at the supply input side of the system and, once charged, the capacitor 11 will then remain charged, without consuming further current or very minimal further current. In this respect, in embodiments, the capacitor 11 may be a ceramic capacitor which offers very low current leakage. The voltage V-bat is higher than the threshold voltage of the gate 6.

The anode of the capacitor 11 is further connected to the MOSFET's gate 6 through starter connection 14, which includes a second diode 15. The second diode 15 is configured to allow current to flow to the gate 6 when the starter circuit 20 is activated, and to block reverse current from the gate driver 6 during periods when the gate driver 6 is activated.

The starter circuit 20 is further provided with a first switch 12 connected as a bypass around the capacitor 11 and is actuatable for discharging the capacitor 11.

A controller 24 is provided to control this first switch 11. The controller 24 may, for example, comprise a current load detection sensor for sensing when the current draw from the load 7 increases, along with an actuator for actuating the first switch 12 and a logic circuit for controlling the actuator based on the sensed current demand.

In use, when the load 7 is in sleep mode, the gate driver 9 will be inactive, and hence the gate 6 will get discharged and the MOSFET 4 won't be conductive. As such, in this circuit, the load 7 is not powered by the illustrated circuit. However, it will be understood that in other embodiments, an alternative power circuit may be provided for providing a lower current to the load 7 for maintaining sleep mode operations. At the same time, the first switch 12 is open and therefore the capacitor 11 is charged by battery 1 up to voltage V_bat and held at this charged state.

When a rising current demand from the load 7 is detected by the controller 24, the controller 24 actuates the first switch 12 to close. This connects the cathode of the capacitor 11 to the battery output voltage, and therefore leads to the anode of the capacitor 11 having a voltage in the range of double the battery voltage V_bat. The starter capacitor 11 thereby discharges starting from V_bat. The first diode 13 acts to block the discharged current, and thereby forces the current flow through starter connection 14 and diode 15 onto the gate 6. The voltage at the gate 6 therefore rises rapidly as the starter capacitor 11 discharges V_bat, causing the gate voltage to exceed the threshold. In embodiments, this discharge may be within some tenths of a nanosecond. Consequently, the MOSFET 4 is activated extremely rapidly.

In the meantime, the rising current demand simultaneously prompts the activation of the gate driver 9, which begins pump charge to its driver capacitor 2. As such, the voltage generated by the gate driver 9 steadily builds until the gate's threshold voltage is achieved, at which point the gate driver is able to control the gate 6. Accordingly, by the time the capacitor 11 has fully discharged or even before, the output voltage from the gate driver 9 is sufficiently high to control the MOSFET 4 to continue to drive the load 7. That is, the charge from the capacitor 11 is used to activate the MOSFET 4 during the lag period when the gate driver 9 is still building its output voltage.

Once the capacitor 11 has started the MOSFET 4, the controller 24 may open the first switch 12 to reset the starter circuit 20 and recharge the capacitor 11, ready for the next start-up operation. In embodiments, this is effected under the control of a timer set to a predetermined estimated discharge time for the capacitor 11 based on its known characteristics. In other embodiments, the controller 24 may detect that the MOSFET 4 has activated before opening the first switch 12.

Figure 3:
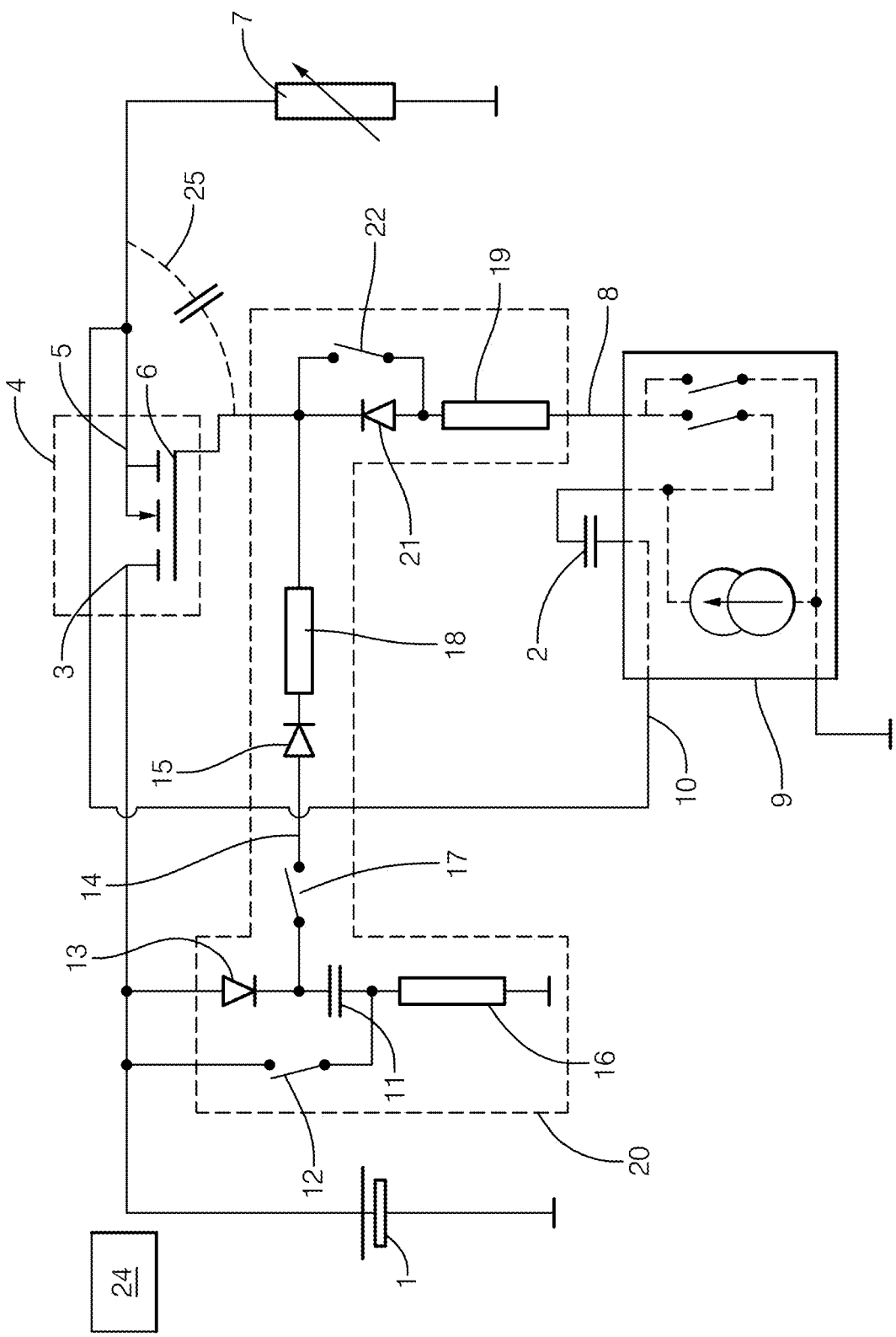
FIG. 3 shows a second embodiment of an apparatus for providing the fast start-up of a switching device.

FIG. 3 shows a second embodiment which operates in substantially the same way as the first embodiment but comprises additional circuit components. In particular, the starter circuit 20 additionally comprises a second switch 17 and a second resistor 18 connected either side of the second diode 15 along the starter connection 14. The second switch 17 enhances the circuit's capacity to switch off the MOSFET 4 by disconnecting the connection path between the gate 6 and the positive battery terminal through the starter connection 14. The starter circuit 20 further comprises a third resistor 19 and a third diode 21 along the output connection 8. A third switch 22 actuatable for bypassing the third diode 21 is also provided. The third diode 21 and third switch 22 are used to protect the gate driver 9 from reverse currents.

In use, as with the first embodiment, when the load is in sleep mode or turned off, the first switch 12 is open and therefore the capacitor 11 is charged by battery 1 up to voltage V_bat. At the same time, the second switch 17 is open for preventing current leakage through the starter connection 14. The third switch 22 is also closed.

When the load is activated, a rising current demand is detected by the controller 24, and the third switch 22 is opened in order to free the MOSFET 4 from the gate driver 9. Both the first switch 12 and the second switch 17 are then actuated to close so that the capacitor 11 discharges. The second resistor 18 regulates the current flow though the starter connection 14 by clipping the peak current. The third diode 21 prevents current from the capacitor 11 from being routed through the gate driver 9, thereby maximising the voltage applied to the gate 6. Again, the voltage at the gate 6 rises rapidly to activate the MOSFET 4 extremely rapidly.

Once the capacitor 11 has started the MOSFET 4, the controller 24 may then open the first switch 12 and the second switch 17 for resetting the capacitor 11 to recharge. At the same time or shortly after, the third switch 22 may be closed for allowing the gate driver's output 8 to control the gate 6 for continuing the normal operating mode.

FIG. 3 further shows schematically the concept of the gate capacitor 25 formed by the gate electrode 6 within the MOSFET 4. As will be appreciated, once the MOSFET has activated, the gate-source capacitance C_gs of the gate capacitor 25 acts to maintain the voltage at the gate 6, while the gate driver 9 controls the MOSFET 4.

Figure 4:
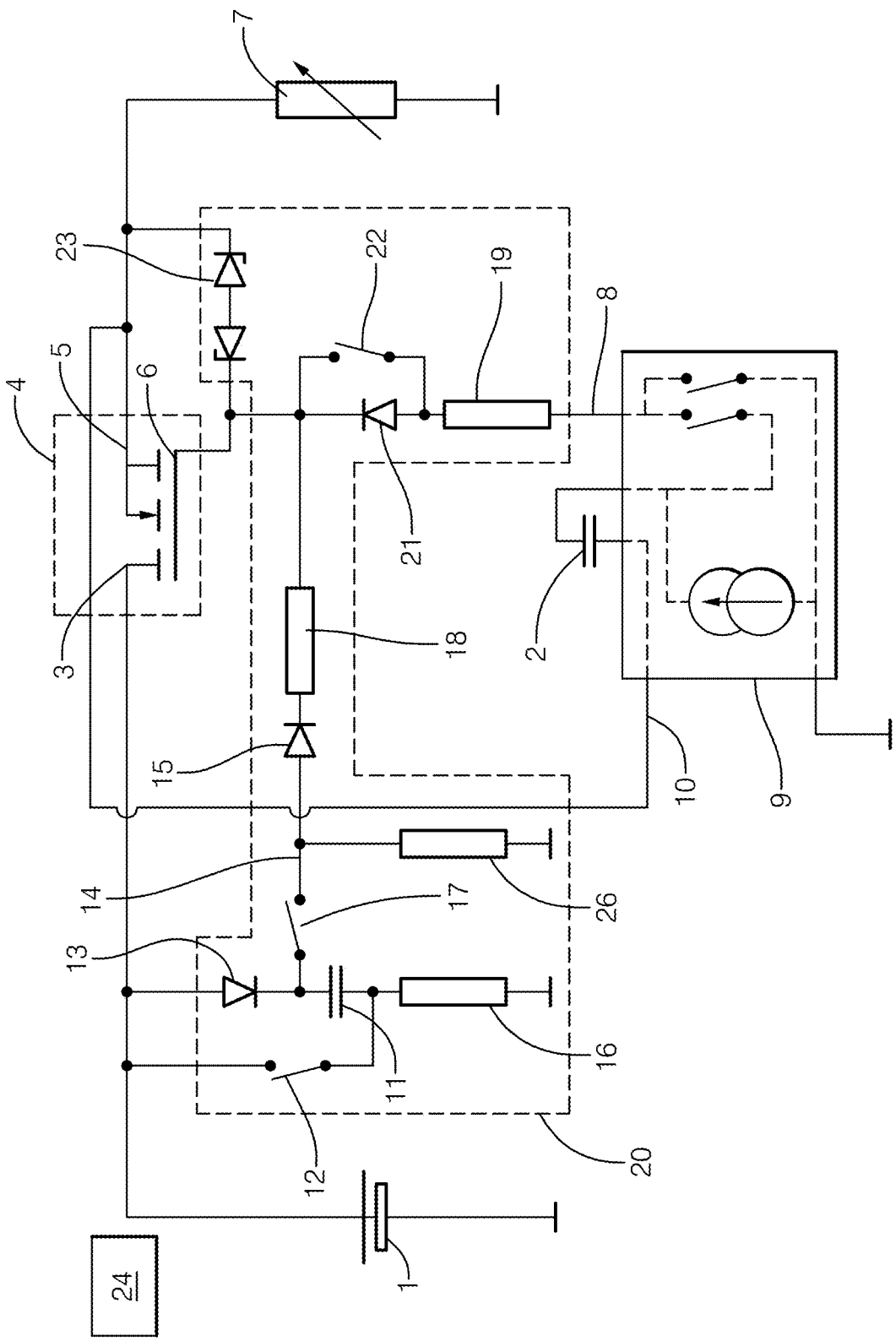
FIG. 4 shows a third embodiment of an apparatus for providing the fast start-up of a switching device.

FIG. 4 shows a third embodiment which operates in substantially the same way as the second embodiment but comprises further additional circuit components. In particular, this embodiment further comprises a fourth resistor 26, between the starter connection 14 and the negative battery terminal, which acts to enhance the blocking effect of second diode 15. In addition, Zener diodes 23 are provided at the gate 6 to source 5 junction to protect the gate 6.

With the above embodiments, the starter circuit 20 may operate independently from the output of the gate driver 9. As such, the switching device 4 can be activated quickly in response to an increased current demand, with the starter circuit's capacitor 11 functioning a charge tank for rapidly activating the switching device 4. This thereby circumvents the delay which would otherwise result from the period in which the drive circuit needs to build its output voltage. In scenarios where a low current is supplied to a load in its sleep mode, a seamless transition to a high current supply can be delivered as soon as the load's operating mode is initiated. That is, embodiments may provide an uninterruptible power supply with auto-wake-up in response to the detection of an increased current demand from a load.

It will be understood that the embodiments illustrated above show applications only for the purposes of illustration. In practice, embodiments may be applied to many different configurations, the detail of which being straightforward for those skilled in the art to implement.

What is claimed is:

1. An apparatus comprising:
a driver circuit for applying control signals to a control terminal of a switching device when activated, the switching device being activatable for driving a load in an operating mode when a control signal above a threshold voltage is applied to the control terminal; and
a starter circuit coupled to the control terminal, the starter circuit comprising:
an energy store comprising charging connections for connecting the energy store to a power source for charging the energy store; and
a switch operable to discharge the energy store for delivering a start-up voltage above the threshold voltage to the control terminal for activating the switching device during a delay period before the driver circuit generates a control signal above the threshold voltage after being activated, the switch comprising a bypass connection for bypassing the charging connections when the switch is operated.

2. The apparatus of claim 1, further comprising:
a controller for actuating the switch to discharge the energy store in response an increased current demand by the load.

3. The apparatus of claim 2, wherein the controller actuates the switch for recharging the energy store after a predetermined time interval following actuation to discharge the energy store.

4. The apparatus of claim 2, wherein the controller actuates the switch for recharging the energy store in response to a detection of the switching device being activated.

5. The apparatus of claim 1, wherein the energy store comprises:
a capacitor.

6. The apparatus of claim 1, wherein the charging connections further comprise:
a diode for directing current discharged from the energy store to the control terminal.

7. The apparatus of claim 1, wherein the power source comprises:
a battery.

8. The apparatus of claim 1, further comprising:
a start-up connection for connecting the energy store to the control terminal of the switching device,
wherein the start-up connection comprises a diode for preventing current flowing from the driver circuit to the energy store.

9. The apparatus of claim 8, wherein the start-up connection further comprises:
a resistor connected between an anode of the diode and a negative terminal of the power source.

10. The apparatus of claim 1, wherein the driver circuit comprises:
an output connection for connecting the driver circuit to the control terminal,
wherein the output connection comprises:
a blocking component for preventing reverse current flowing to the driver circuit.

11. The apparatus of claim 10, wherein the blocking component comprises at least one of:
a diode; or
a bypass switch.

12. The apparatus of claim 1, wherein the switching device comprises:
a MOSFET.

13. A method comprising:
generating a control signal;
applying the control signal to a control terminal of a switching device when activated;
determining if the control signal is above a threshold voltage;
responsive to determining that the control signal is above the threshold voltage, activating the switching device to drive a load in an operating mode;
storing a charge above the threshold voltage in an energy store, the energy store comprising charging connections for connecting the energy store to a power source for charging the energy store; and
operating a switch to discharge the energy store to deliver a start-up voltage to the control terminal for activating the switching device during a delay period, wherein the delay period takes place before a control signal above the threshold voltage is generated after the switching device is activated, the switch comprising a bypass connection for bypassing the charging connections when the switch is operated.

14. The method of claim 13, further comprising:
determining current demand by the load,
wherein operating the switch comprises operating the switch to discharge the energy store responsive to determining an increased current demand by the load.

15. The method of claim 14, further comprising:
responsive to determining an expiration of a predetermined time interval following operation of the switch, further operating the switch to recharge the energy store.

16. The method of claim 13, further comprising:
responsive to detecting an activation of the switching device, further operating the switch to recharge the energy store.

17. The method of claim 13, wherein the energy store comprises a capacitor.

18. The method of claim 13, further comprising:
directing, using a diode of the charging connections, current discharged from the energy store to the control terminal.

19. The method of claim 13, wherein the power source comprises a battery.

20. The method of claim 13, wherein the switching device comprises a MOSFET.

* * * * *